(12) United States Patent
 Komaki

(10) Patent No.: US 10,732,523 B2
(45) Date of Patent: Aug. 4, 2020

(54) DETECTION DEVICE, IMPRINT APPARATUS, METHOD OF MANUFACTURING ARTICLE, ILLUMINATION OPTICAL SYSTEM, AND DETECTION METHOD

(71) Applicant: CANON KABUSHIKI KAISHA, Tokyo (JP)

(72) Inventor: Takamitsu Komaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 61 days.

(21) Appl. No.: 15/753,924

(22) PCT Filed: Aug. 3, 2016

(86) PCT No.: PCT/JP2016/003582
§ 371 (c)(1),
(2) Date: Feb. 20, 2018

(87) PCT Pub. No.: WO2017/033410
PCT Pub. Date: Mar. 2, 2017

(65) Prior Publication Data
US 2018/0259863 A1  Sep. 13, 2018

(30) Foreign Application Priority Data

Aug. 21, 2015  (JP) ................... 2015-164014

(51) Int. Cl.
*G03F 9/00* (2006.01)
*G03F 7/00* (2006.01)
(Continued)

(52) U.S. Cl.
CPC ............ *G03F 9/7042* (2013.01); *B29C 59/02* (2013.01); *G01D 5/28* (2013.01); *G03F 7/0002* (2013.01);
(Continued)

(58) Field of Classification Search
CPC .. G03F 9/7042; G03F 7/70191; G03F 7/0002; H01L 21/027; B29C 59/02; G01D 5/28
See application file for complete search history.

(56) References Cited

U.S. PATENT DOCUMENTS 9,304,403 B2 *   4/2016  Lin ................... G03F 9/7084
10,365,565 B2 *  7/2019  Pandey .............. G01N 21/4788
2004/0263977 A1  12/2004 Toyoda
(Continued)

FOREIGN PATENT DOCUMENTS

JP     64-83101 A    3/1989
JP    H05-259029 A  10/1993
(Continued)

*Primary Examiner* — Hina F Ayub
(74) *Attorney, Agent, or Firm* — Canon U.S.A., Inc. IP Division

(57) ABSTRACT

A detection device includes an illumination optical system configured to illuminate a first alignment mark for detecting a position of an object in a first direction and a second alignment mark for detecting a position of the object in a second direction and a detection optical system configured to detect light beams from the alignment marks. The illumination optical system includes an optical element disposed at a position optically conjugate to a surface to be illuminated, and the optical element includes a region configured to form an illumination light beam for illuminating a first portion of the surface to be illuminated with a first angular distribution and a region configured to form an illumination light beam for illuminating a second portion of the surface to be illuminated with a second angular distribution.

20 Claims, 12 Drawing Sheets

(51) Int. Cl.
    *B29C 59/02* (2006.01)
    *G01D 5/28* (2006.01)
    *G03F 7/20* (2006.01)
    *H01L 21/027* (2006.01)
(52) U.S. Cl.
    CPC ........ *G03F 7/70191* (2013.01); *H01L 21/027* (2013.01)

(56) References Cited

U.S. PATENT DOCUMENTS

| | | |
|---|---|---|
| 2005/0179881 A1 | 8/2005 | Kohno |
| 2006/0072095 A1* | 4/2006 | Kudo .................... G03B 27/42 |
| | | 355/67 |
| 2006/0203214 A1 | 9/2006 | Shiraishi |
| 2007/0024839 A1* | 2/2007 | Kawakami ............. G03B 27/72 |
| | | 355/69 |
| 2007/0051903 A1* | 3/2007 | Chen ................... G01N 21/6428 |
| | | 250/458.1 |
| 2008/0230725 A1* | 9/2008 | Taniguchi ............ B23K 26/066 |
| | | 250/492.22 |
| 2012/0328725 A1 | 12/2012 | Minoda |
| 2013/0100459 A1 | 4/2013 | Iwai |
| 2013/0221556 A1* | 8/2013 | Miyaharu ............. B29C 59/002 |
| | | 264/40.1 |
| 2016/0334618 A1* | 11/2016 | Hargis ............... G02B 26/0875 |
| 2019/0142257 A1* | 5/2019 | Vinther ............... A61B 1/00009 |
| 2019/0196214 A1* | 6/2019 | Schuck .................. G02B 27/26 |

FOREIGN PATENT DOCUMENTS

| | | |
|---|---|---|
| JP | 7-321028 A | 12/1995 |
| JP | 2002-122412 A | 4/2002 |
| JP | 2013-102139 A | 5/2013 |
| KR | 10-2013-0044149 A | 5/2013 |

* cited by examiner

[Fig. 1]
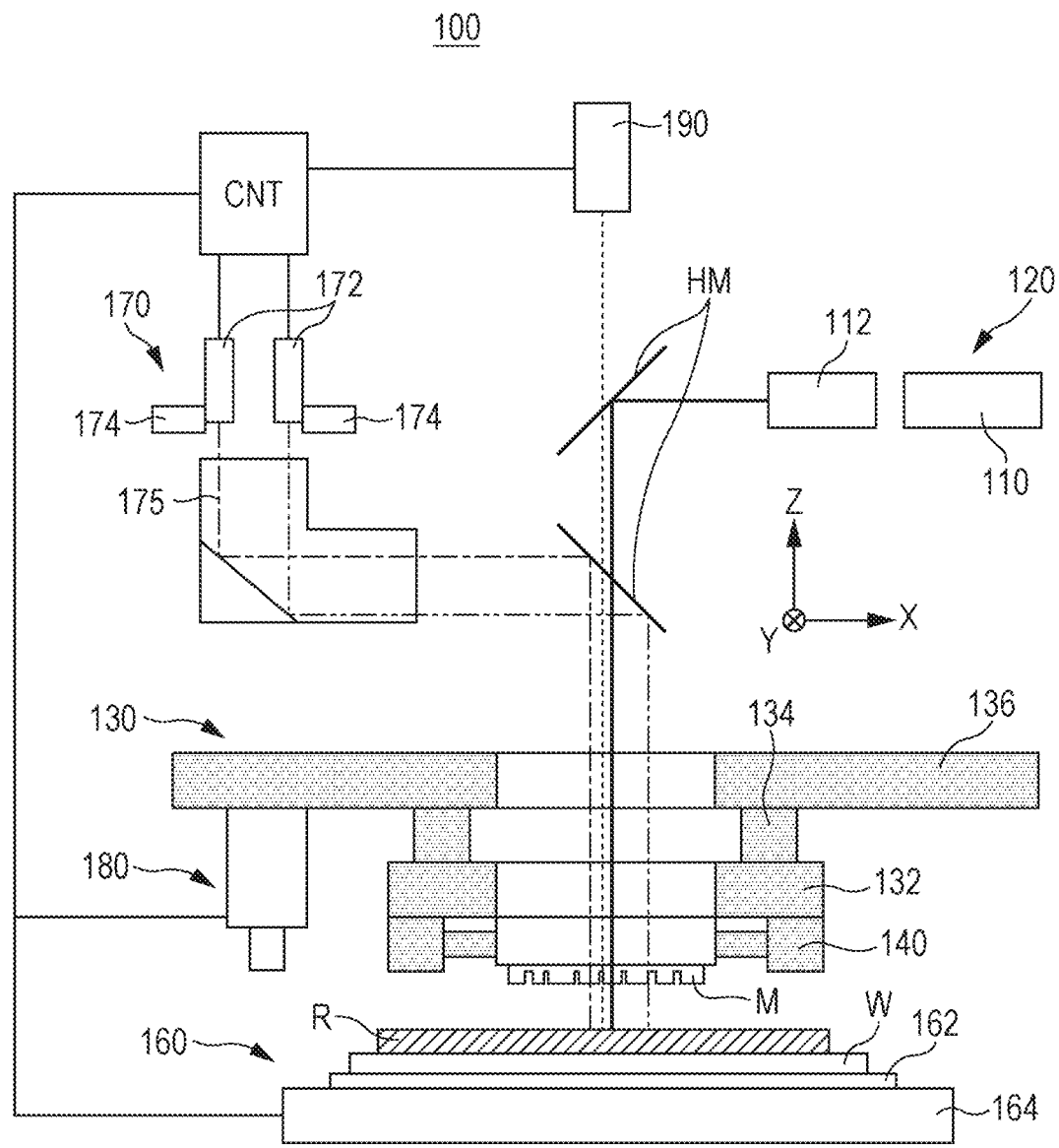

[Fig. 2]
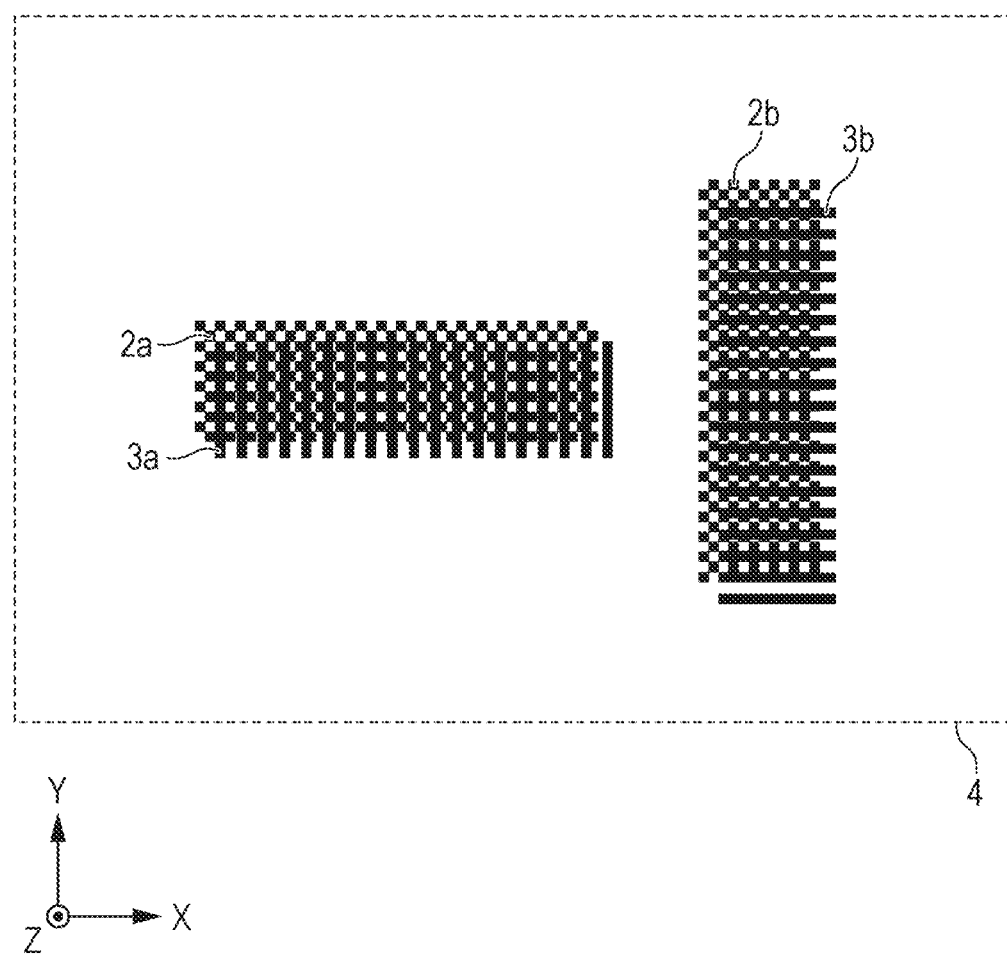

[Fig. 3]
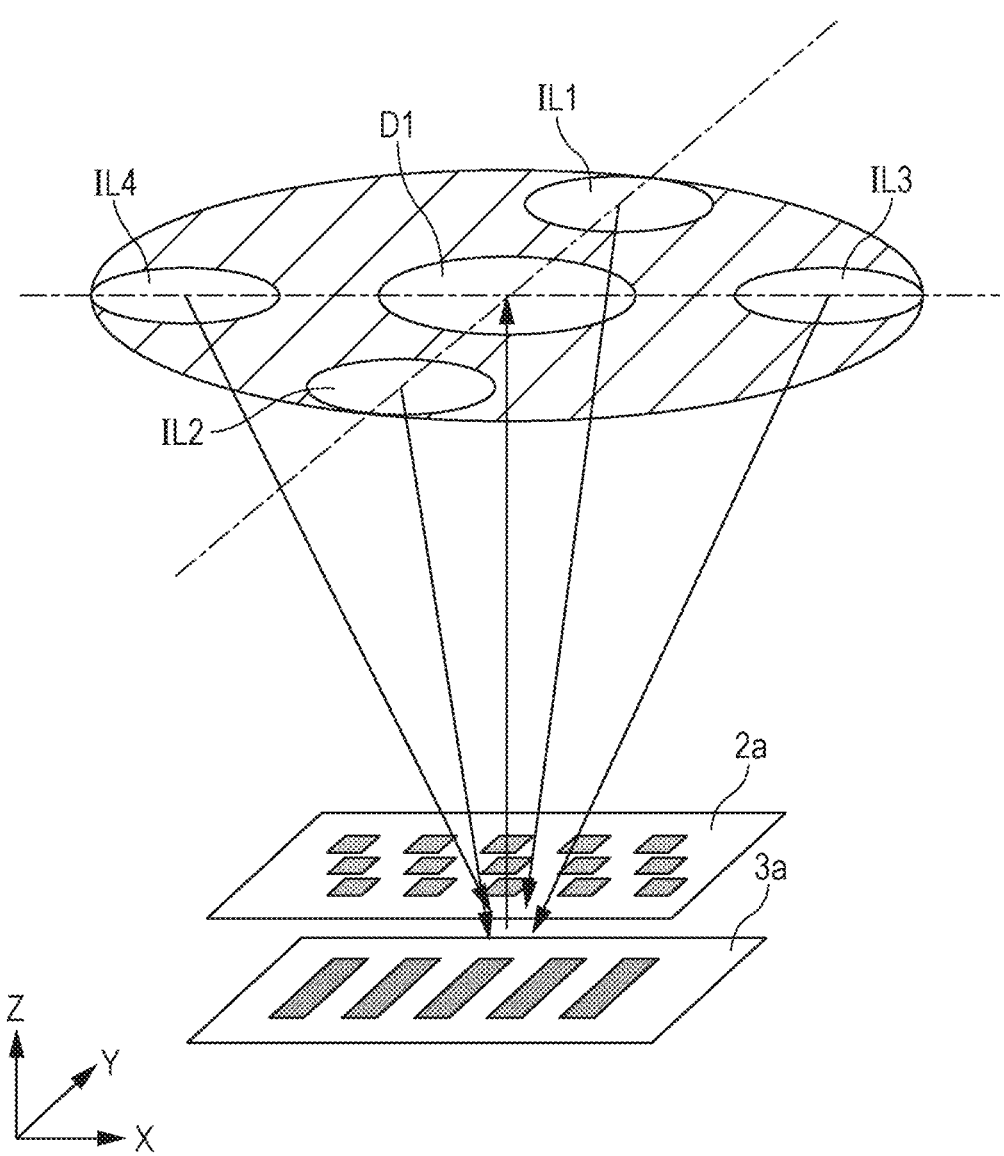

[Fig. 4A]
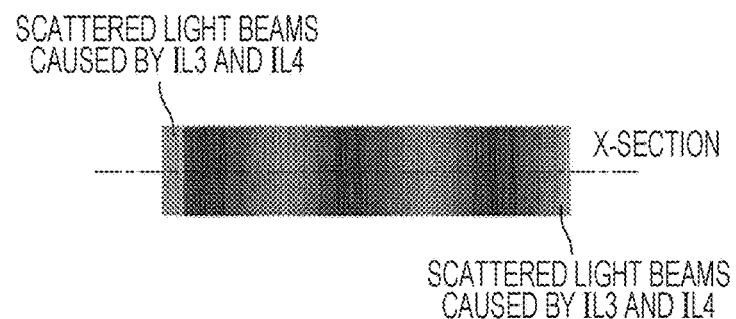
[Fig. 4B]
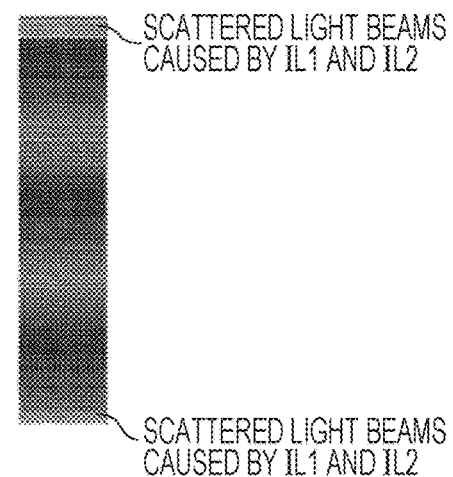
[Fig. 4C]
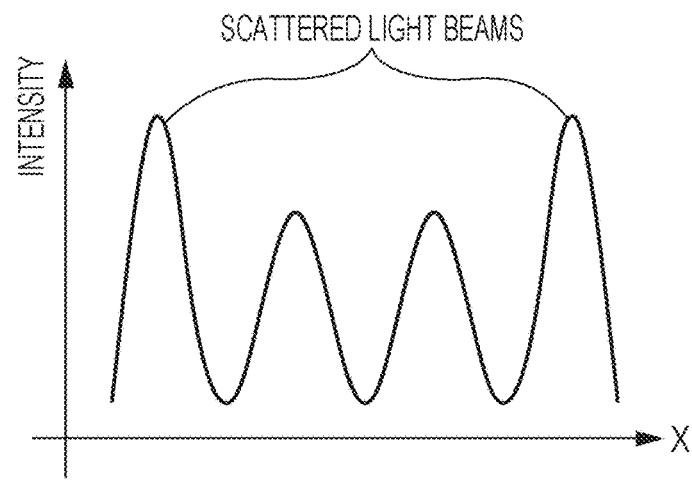

[Fig. 5A]
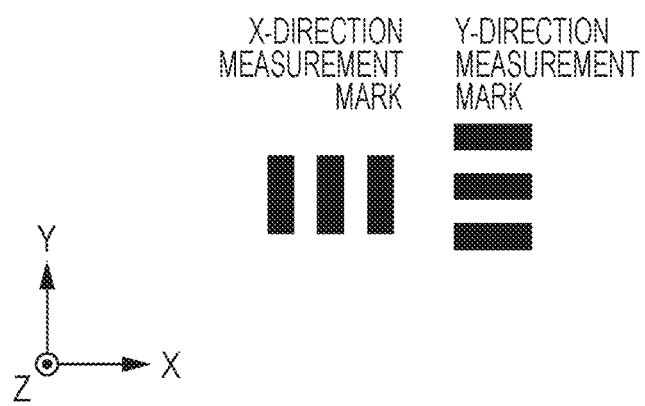
[Fig. 5B]
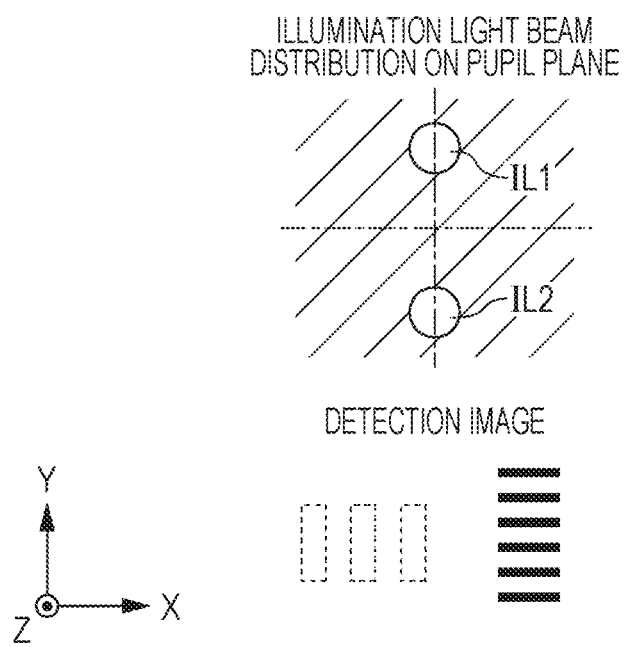

[Fig. 5C]
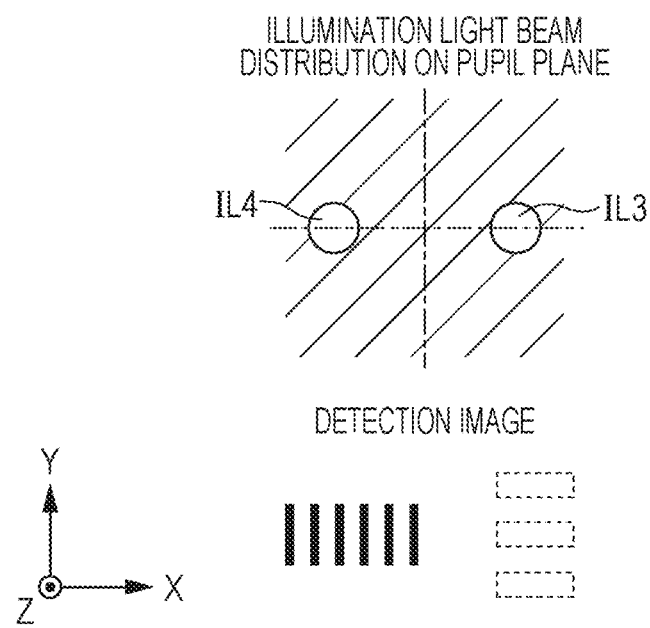
[Fig. 5D]
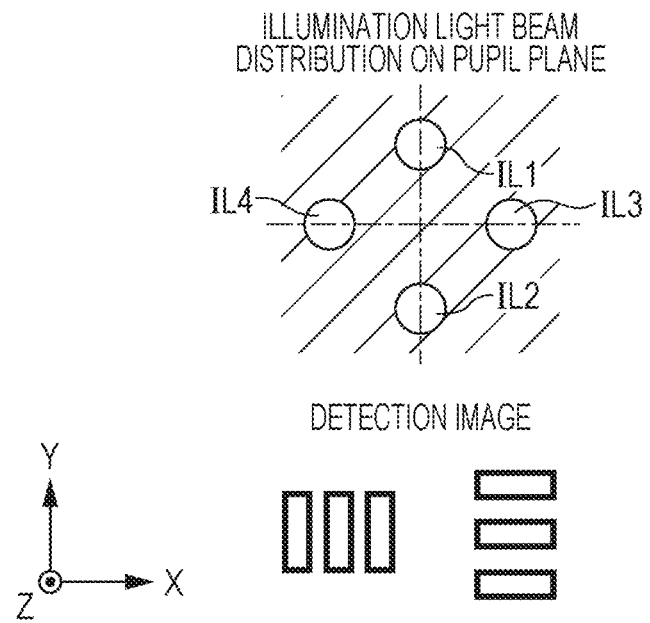

[Fig. 6]
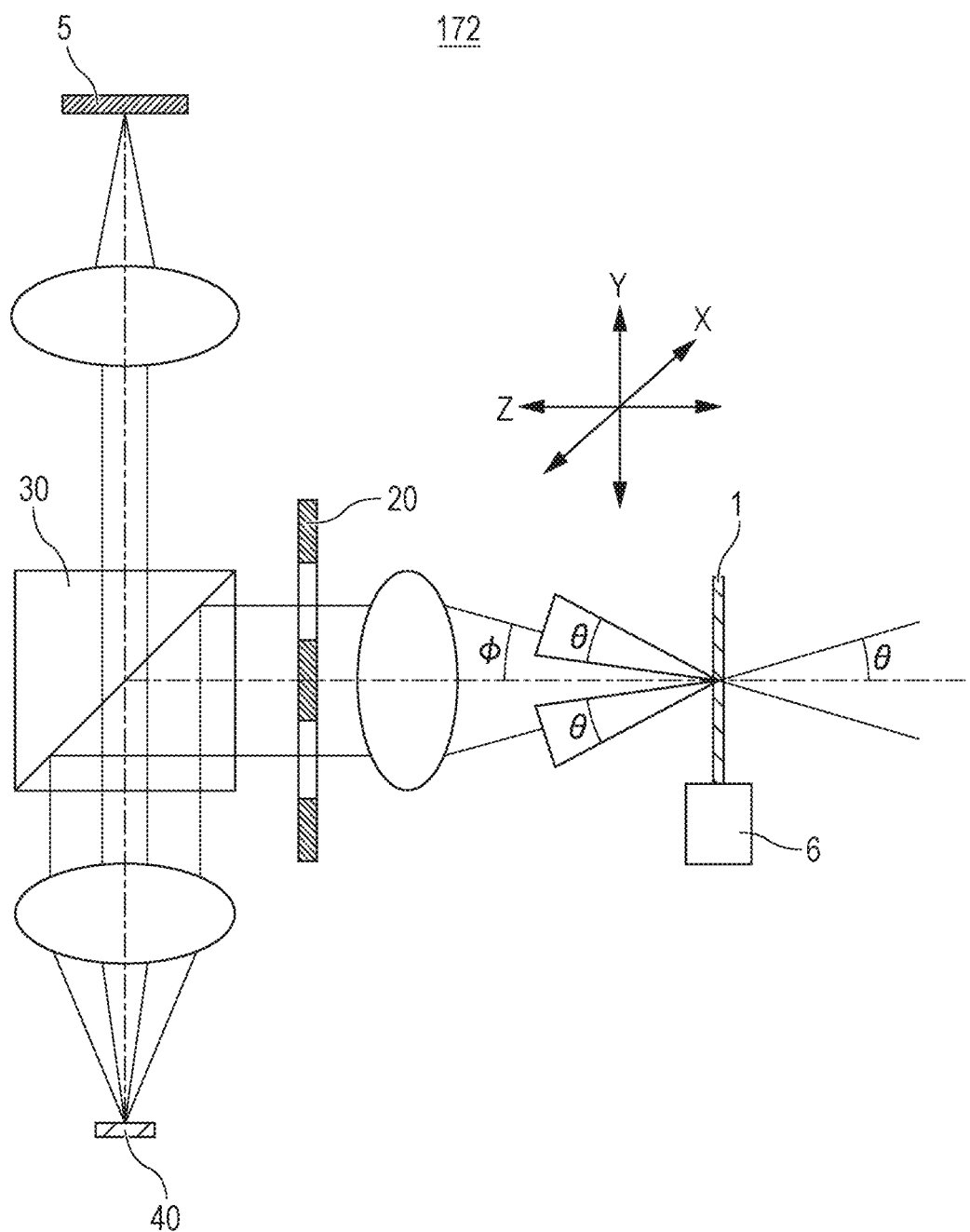

[Fig. 7]
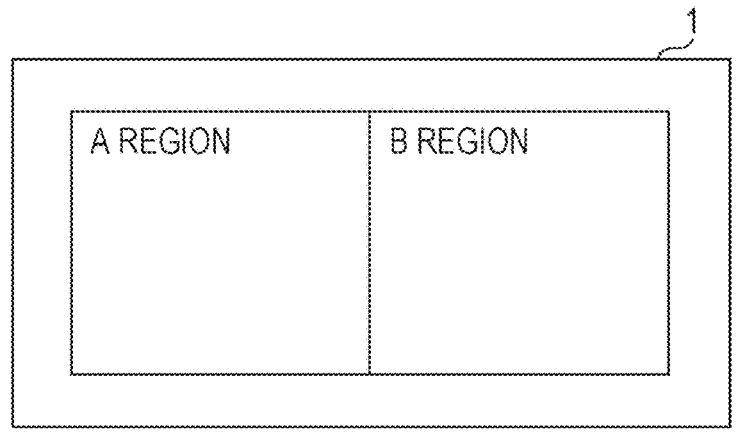
[Fig. 8A]
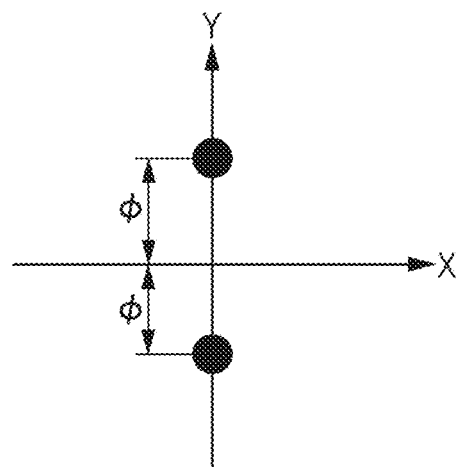
[Fig. 8B]
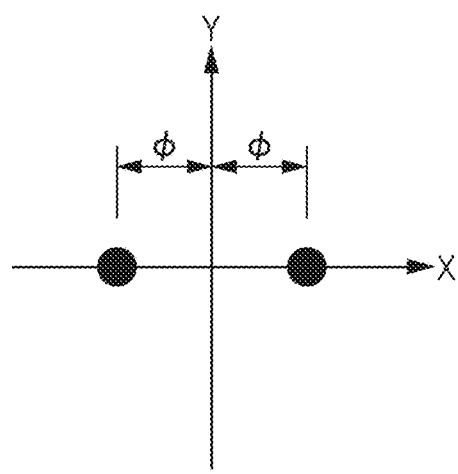

[Fig. 9A]
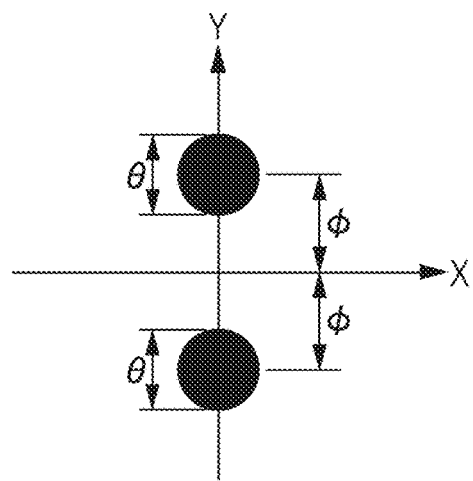
[Fig. 9B]
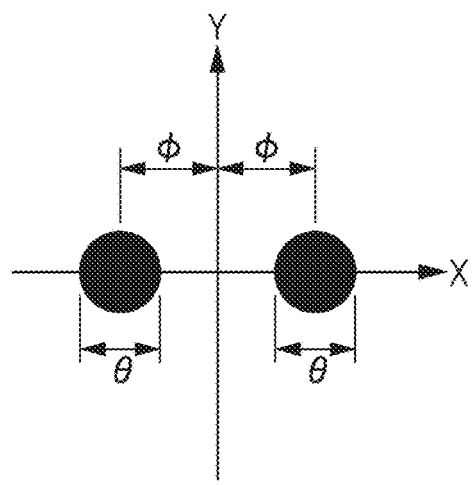

[Fig. 10]
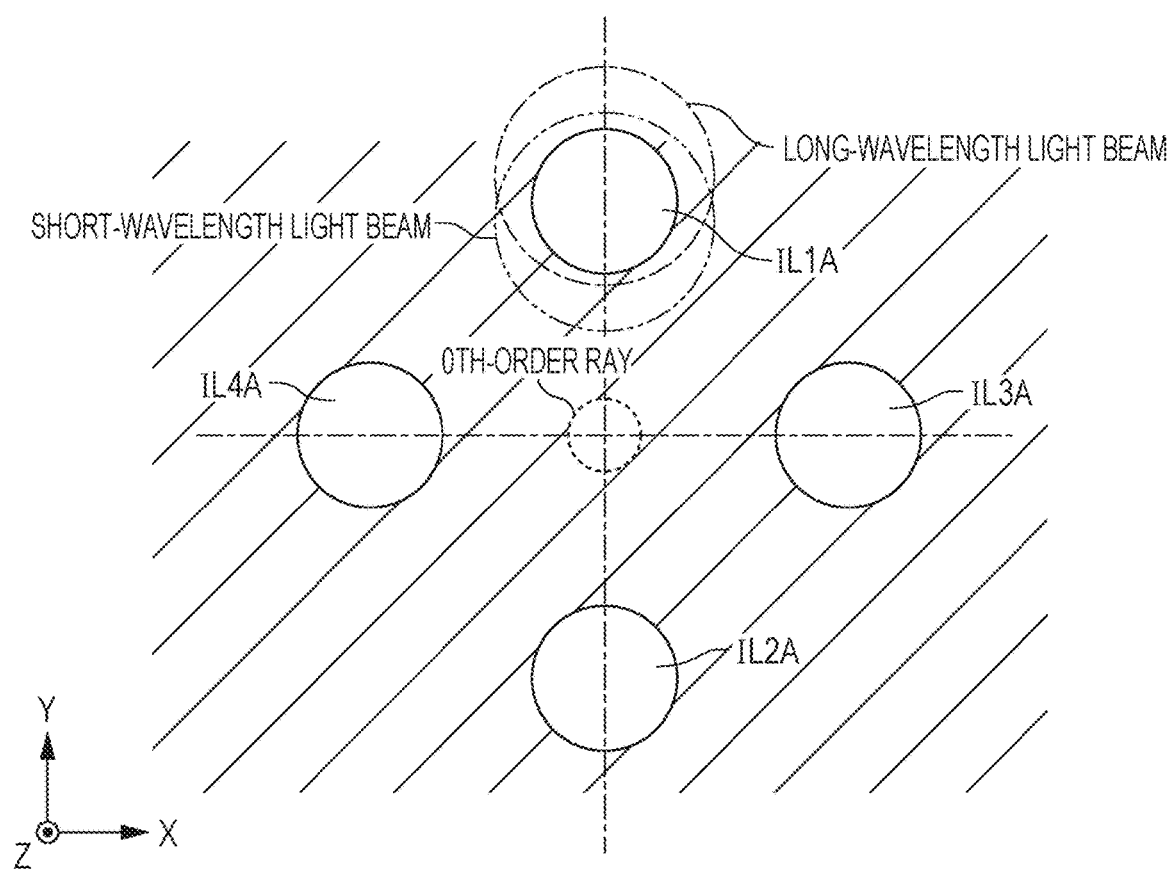

[Fig. 11]
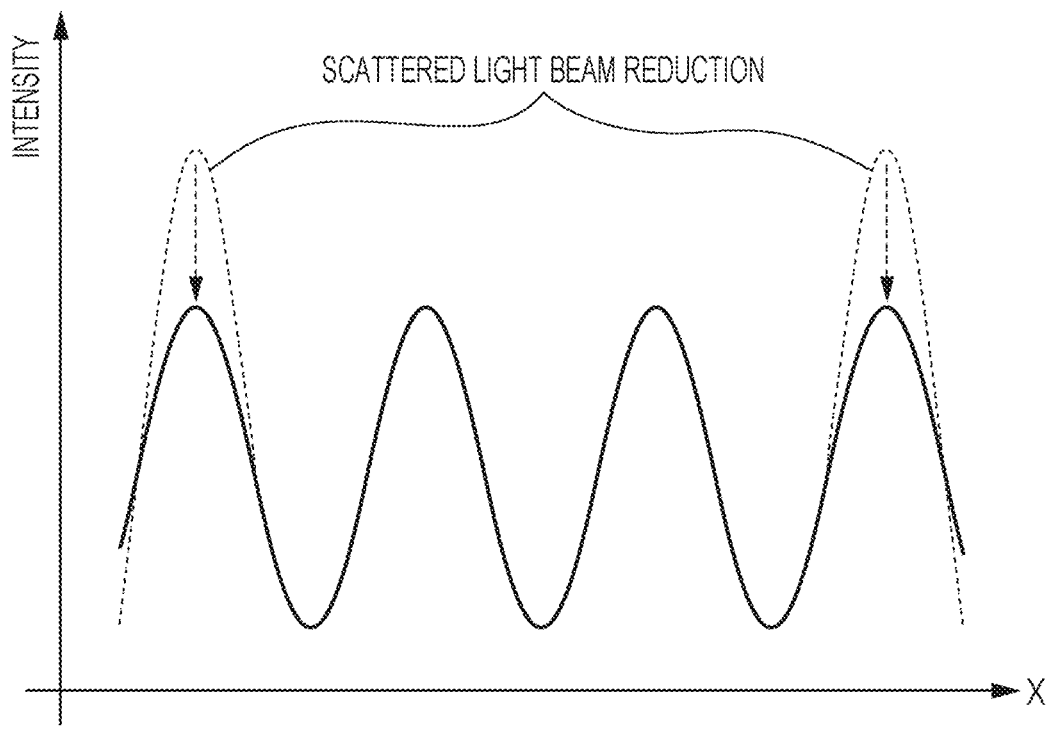
[Fig. 12]
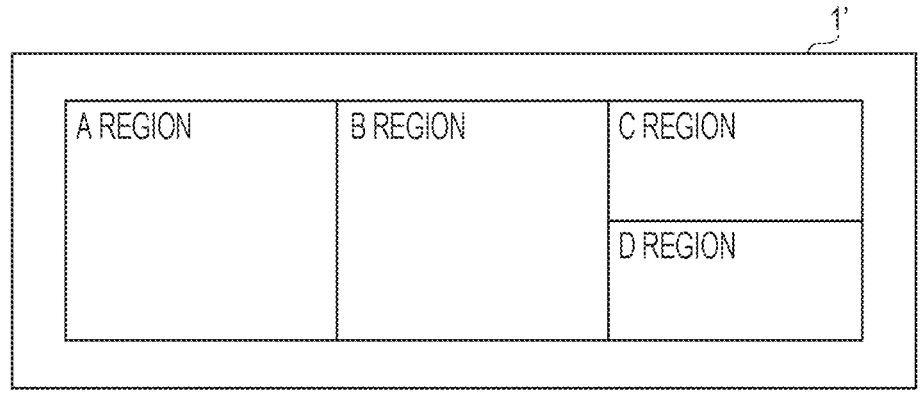

[Fig. 13]
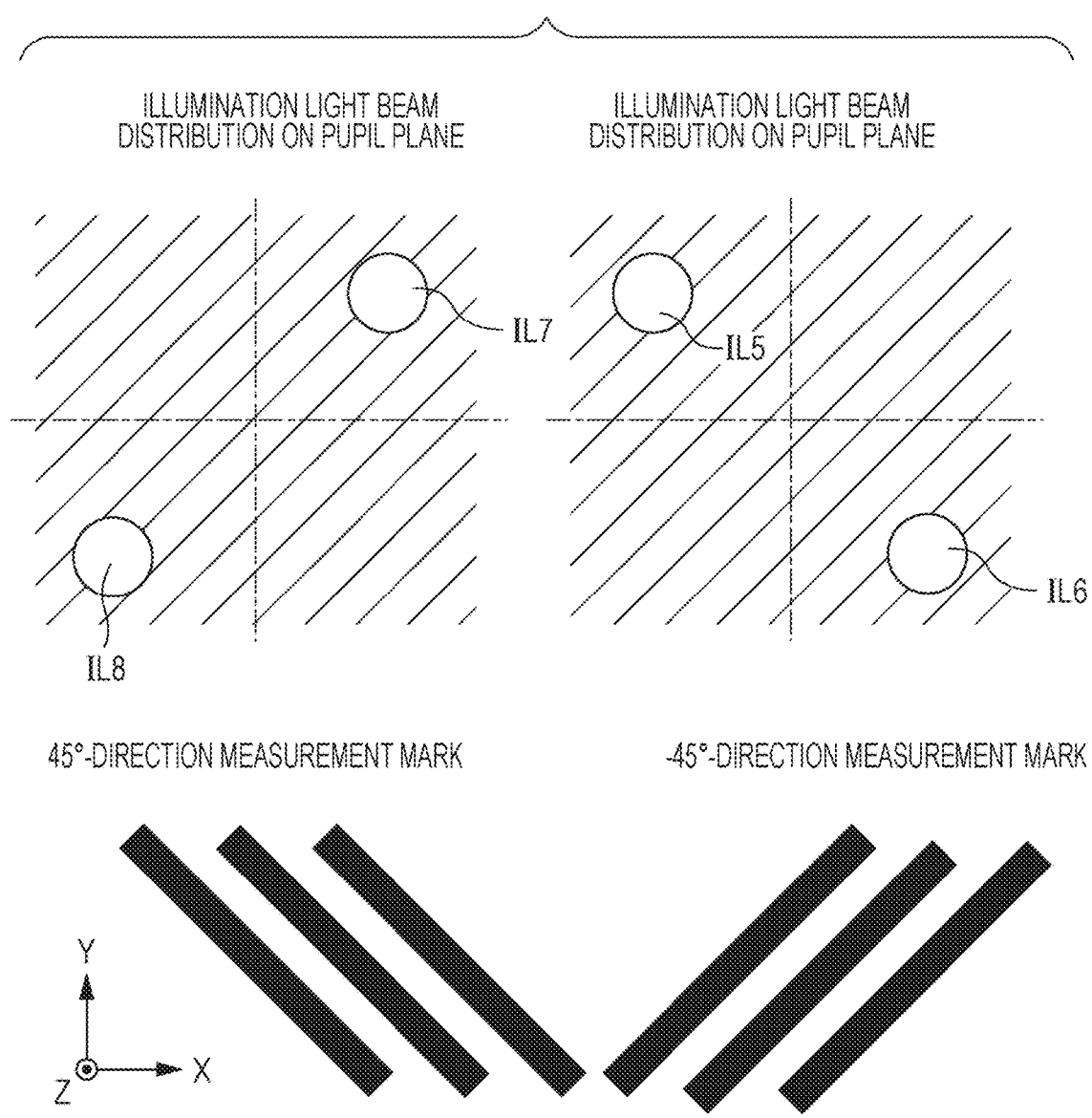

DETECTION DEVICE, IMPRINT APPARATUS, METHOD OF MANUFACTURING ARTICLE, ILLUMINATION OPTICAL SYSTEM, AND DETECTION METHOD

TECHNICAL FIELD

The present invention relates to a detection device, an imprint apparatus, a method of manufacturing an article, an illumination optical system, and a detection method.

BACKGROUND ART

An imprint technique is a technique of forming a fine pattern on a substrate by shaping an imprint material applied on a substrate with a mold. For example, a photocuring technique is one of such imprint techniques. In an imprint technique that employs a photocuring technique, an imprint material (photocurable resin) is first supplied to a shot, which is an imprint region, on a substrate. The imprint material is irradiated with light in a state in which a pattern in a mold is pressed against the imprint material, and the imprint material is thus cured. The mold is released from the cured resin, and thus a pattern made of resin is formed on the substrate.

In order to press a pattern in a mold against an imprint material on a substrate, the substrate and the mold need to be positioned relative to each other with high accuracy. For positioning a substrate and a mold relative to each other in an imprint apparatus, a so-called die-by-die method is known in which the positioning is achieved by detecting a mark formed on the mold and a mark formed in each shot on the substrate.

PTL 1 discloses an imprint apparatus provided with a detector that detects a positioning mark formed on each of a mold and a substrate and obtains the position in the X-direction and the position in the Y-direction on the substrate surface. Specifically, an X mark for detecting the position in the X-direction and a Y mark for detecting the position in the Y-direction are both illuminated, and light beams from the two marks are imaged by a single image sensor.

With the detector described in PTL 1, an unwanted light beam scattered, for example, by an edge of a positioning mark may be generated, and the unwanted light beam may reach the image sensor. Thus, the unwanted light beam may result in noise in the detection light beam from the mark, and the accuracy in measuring the position of the mark may be reduced.

CITATION LIST

Patent Literature

PTL 1: Japanese Patent Laid-Open No. 2013-102139

SUMMARY OF INVENTION

An aspect of the present invention provides a detection device that includes an illumination optical system configured to illuminate a first alignment mark for detecting a position of an object in a first direction and a second alignment mark for detecting a position of the object in a second direction that is different from the first direction, and a detection optical system configured to detect light beams from the first alignment mark and the second alignment mark. The illumination optical system includes an optical element disposed at a position optically conjugate to a surface to be illuminated, and the optical element includes a region configured to form an illumination light beam for illuminating a first portion of the surface to be illuminated with a first angular distribution and a region configured to form an illumination light beam for illuminating a second portion that is different from the first portion of the surface to be illuminated with a second angular distribution that is different from the first angular distribution. The detection optical system is configured to detect a light beam from the first alignment mark in the first portion of the surface to be illuminated with the first angular distribution and to detect a light beam from the second alignment mark in the second portion of the surface to be illuminated with the second angular distribution.

Further features of the present invention will become apparent from the following description of exemplary embodiments with reference to the attached drawings.

BRIEF DESCRIPTION OF DRAWINGS

FIG. 1 illustrates an overview of an imprint apparatus.
FIG. 2 illustrates an alignment mark.
FIG. 3 illustrates how an alignment mark is illuminated and detected.
FIG. 4A illustrates a detection signal of a light beam from an alignment mark.
FIG. 4B illustrates a detection signal of a light beam from an alignment mark.
FIG. 4C illustrates a detection signal of a light beam from an alignment mark.
FIG. 5A illustrates a relationship between an illumination light beam for a mark and a detection image.
FIG. 5B illustrates a relationship between an illumination light beam for a mark and a detection image.
FIG. 5C illustrates a relationship between an illumination light beam for a mark and a detection image.
FIG. 5D illustrates a relationship between an illumination light beam for a mark and a detection image.
FIG. 6 illustrates a configuration of an alignment scope.
FIG. 7 illustrates a configuration of an optical element.
FIG. 8A is an illustration for describing a diffraction effect of an optical element.
FIG. 8B is an illustration for describing a diffraction effect of an optical element.
FIG. 9A illustrates an optical intensity distribution on a pupil plane of an illumination optical system.
FIG. 9B illustrates an optical intensity distribution on a pupil plane of an illumination optical system.
FIG. 10 illustrates a configuration of an aperture stop.
FIG. 11 illustrates a detection signal of an alignment scope.
FIG. 12 illustrates a modification of an optical element.
FIG. 13 illustrates a modification of a mark and an illumination light beam.

DESCRIPTION OF EMBODIMENTS

Hereinafter, exemplary embodiments of the present invention will be described in detail with reference to the appended drawings.

An imprint apparatus according to the present exemplary embodiment will be described with reference to FIG. 1. As an example, an ultraviolet (UV) radiation curing imprint apparatus in which an imprint material (resin) is irradiated with UV radiation and thus cured will be described. The present exemplary embodiment, however, can also be applied to an imprint apparatus in which a resin is irradiated with radiation in other wavelength ranges and thus cured or to an imprint apparatus in which a resin is irradiated with energy in another form (e.g., heat) and thus cured. An imprint apparatus 100 is configured to form a pattern in a plurality of shot regions on a substrate W (wafer) by repeating imprint processing. Herein, the imprint processing refers to processing in which a pattern is formed in a shot region on a substrate W by bringing a pattern portion in a mold M into contact with an imprint material and curing the imprint material in a state in which the pattern portion is pressed (imprinted) against the imprint material. The imprint apparatus 100 may include a curing unit 120, a mold operation mechanism 130, a mold shape correction mechanism 140, a substrate driving unit 160, a detector 170, an application mechanism 180, an observation scope 190, and a control unit CNT. The imprint apparatus 100 also includes a bridge surface plate for holding the mold operation mechanism 130, a base surface plate for holding the substrate driving unit 160, and so on, although not depicted in the drawings. In FIG. 1, the X-axis and the Y-axis lie within a plane parallel to the surface of the substrate W, and the Z-axis extends in a direction perpendicular to the X-axis and the Y-axis.

The curing unit 120 irradiates an imprint material (resin, resist) R on the substrate W with ultraviolet radiation through the mold M so as to cure the imprint material R. The imprint material R is an ultraviolet radiation curable resin. The curing unit 120 includes, for example, a light source unit 110 and an optical system 112. The light source unit 110 may include, for example, a light source, such as a mercury lamp, that emits ultraviolet radiation (e.g., i-line, g-line) and an ellipsoidal mirror that focuses the radiation emitted by the light source. The optical system 112 may include a lens, an aperture, a half-silvered mirror HM, and so on for irradiating an imprint material R in a shot region with radiation for curing the imprint material R. The aperture is used to control the angle of view or to control blocking of radiation in a peripheral region. By controlling the angle of view, only a target shot region can be irradiated, and by controlling blocking of radiation in a peripheral region, a region outside the shot region on the substrate can be prevented from being irradiated with the ultraviolet radiation. The optical system 112 may include an optical integrator for uniformly irradiating the mold. The radiation whose range has been regulated by the aperture is incident on the imprint material R on the substrate through an imaging optical system and the mold M. The mold M is, for example, a mold in which a concave and convex pattern, such as a circuit pattern of a device, is formed three-dimensionally. The material for the mold M is quartz or the like that can transmit ultraviolet radiation.

The mold operation mechanism 130 may include, for example, a mold chuck 132 that holds the mold M, a mold driving mechanism 134 that drives the mold M by driving the mold chuck 132, and a mold base 136 that supports the mold driving mechanism 134. The mold driving mechanism 134 includes a positioning mechanism that controls the position of the mold M along six axes and a mechanism that presses the mold M against the substrate W or the imprint material R on the substrate W and releases the mold M from the cured imprint material M. Herein, the six axes correspond to the X-axis, the Y-axis, the Z-axis, and the rotations about the X-axis, the Y-axis, and the Z-axis in the XYZ coordinate system in which the support surface (the surface on which the substrate W is supported) of the mold chuck 132 is the XY-plane and the direction orthogonal to the XY-plane is the Z-axis.

The mold shape correction mechanism 140 may be mounted to the mold chuck 132. The mold shape correction mechanism 140 can correct the shape of the mold M, for example, by adding pressure to the mold from the outer periphery thereof with the use of a cylinder that operates with a fluid, such as the air or an oil. Alternatively, the mold shape correction mechanism 140 includes a temperature control unit that controls the temperature of the mold M and corrects the shape of the mold M by controlling the temperature of the mold M. The substrate W may deform (typically, expand or contract) as being subjected to a process, such as heat treatment. In response to such a deformation of the substrate W, the mold shape correction mechanism 140 corrects the shape of the mold M such that an overlay error between the pattern in the mold M and the pattern formed on the substrate W is contained within a permissible range.

The substrate driving unit 160 may include, for example, a substrate chuck 162 that holds the substrate W by sucking the substrate W, a substrate stage 164 that drives the substrate W by driving the substrate chuck 162, and a stage driving mechanism (not illustrated). The stage driving mechanism may include a positioning mechanism that controls the position of the substrate W by controlling the position of the substrate stage 164 along the above-described six axes.

The detector (detection device) 170 may include, for example, an alignment scope 172, a stage mechanism 174, and an optical system 175. The detector 170 detects the relative position (positional deviation) of the mold M and a shot region on the substrate W. The alignment scope 172 detects an alignment mark formed on the mold M and an alignment mark formed on the substrate W. The stage mechanism 174 positions the alignment scope 172 on the basis of the position of the mark on the substrate W. The optical system 175 may include a lens, an aperture, a mirror, a half-silvered mirror, and so on for adjusting the optical path of the alignment scope 172.

The application mechanism 180 applies an imprint material onto the substrate W. The application mechanism 180 may include a tank that stores an imprint material, a nozzle that discharges an imprint material supplied from the tank through a supply channel onto a substrate, a valve provided in the supply channel, and a supply amount control unit. The supply amount control unit typically controls the amount of the imprint material supplied onto the substrate W by controlling the valve so that the imprint material is applied to a single shot region in one instance of an imprint material discharge operation.

The observation scope 190 is a scope for observing an entire shot region and includes an image sensor that captures an image of an entire shot region. The observation scope 190 is used to check the state of imprinting between the mold M and the imprint material R or the progress in filling a concave and convex portion of the pattern in the mold M with the imprint material R.

Imprint processing of the imprint apparatus 100 will be described. First, the control unit CNT transports the substrate W onto the substrate chuck 162 and fixes the substrate W to the substrate chuck 162. Then, the control unit CNT moves the substrate stage 164 to the application position of the application mechanism 180. Thereafter, the application mechanism 180 applies the imprint material R to a predetermined shot (imprint region) on the substrate W in an application step (application step). Next, the control unit CNT moves the substrate stage 164 so that the application surface of the substrate W is located directly underneath the mold M.

Next, the control unit CNT drives the mold driving mechanism 134 and presses the mold M against the imprint material R on the substrate W (mold pressing step). At this point, being pressed by the mold M, the imprint material R flows along the pattern surface formed in the mold M. In this state, the detector 170 detects light beams from the marks disposed on the substrate W and the mold M. On the basis of the detection result, the control unit CNT carries out the positioning of the mold M and the substrate W relative to each other by driving the substrate stage 164, the correction of the shape of the mold M with the use of the mold shape correction mechanism 140, and so on. Thus, the imprint material R flows onto the pattern surface in the mold M (filling), the mold M and the substrate W are positioned relative to each other, and the shape of the mold M is corrected sufficiently. Then, the curing unit 120 irradiates the mold M with ultraviolet radiation from the back surface (top face) of the mold M, and the imprint material R is cured by the ultraviolet radiation that has been transmitted through the mold M (curing step). Thereafter, the mold driving mechanism 134 is driven again so as to release the mold M from the substrate W (mold releasing step), and thus the concave and convex pattern in the mold M is transferred onto the imprint material R on the substrate W.

Alignment marks and a conventional alignment scope S will now be described with reference to FIGS. 2 through 5D. FIG. 2 illustrates a state in which patterns 2a and 2b serving as an alignment mark formed on the mold M and patterns 3a and 3b serving as an alignment mark formed on the substrate W are superimposed on each other in a mark observation region 4. The mark observation region 4 is an observation field of view of the alignment scope S. The patterns 2a and 2b are each a checkerboard-like lattice pattern having a lattice pitch P1 in the y-direction and a lattice pitch P2 in the x-direction. The patterns 3a and 3b are each a lattice pattern having a lattice pitch P3, which is different from the lattice pitch P2, only in the x-direction. In a state in which these two lattice patterns are superimposed on each other, diffracted light beams from the lattice patterns interfere with each other to form a moire fringe (interfered light beams), and this moire fringe is detected. The pattern 2a and the pattern 3a are the marks (first alignment mark) for detecting the relative position of the mold M and the substrate W (object) in the X-direction. The pattern 2b and the pattern 3b are the marks (second alignment mark) for detecting the relative position of the mold M and the substrate W in the Y-direction.

The conventional alignment scope S illuminates the patterns 2a and 2b on the substrate W and the patterns 3a and 3b on the mold M with illumination distributions IL1 through IL4 on a pupil plane of an illumination optical system illustrated in FIG. 3. The illumination distribution on the pupil plane corresponds to the angular distribution of a light beam incident on a position of a surface to be illuminated. The alignment scope S detects the light beams from the patterns 2a and 3a and the light beams from the patterns 2b and 3b that have passed through a detection aperture D via the mold M (through the mold (TTM) detection). Thus, the patterns 2a and 3a and the patterns 2b and 3b can be observed simultaneously with the alignment scope S. The patterns 2a and 3a are illuminated with light beams from the illumination light beams IL1 and IL2, and the light beams diffracted by the patterns 2a and 3a are detected by an image sensor or the like in the form of a moire fringe signal illustrated in FIG. 4A. The relative position of the pattern 2a and the pattern 3a, or in other words, the relative position of the mold M and the substrate W is obtained from the stated moire fringe signal. Meanwhile, the patterns 2b and 3b are illuminated with light beams from the illumination light beams IL3 and IL4, and the light beams diffracted by the patterns 2b and 3b are detected in the form of a moire fringe signal illustrated in FIG. 4B.

It is to be noted that the patterns 2a and 3a are illuminated with the illumination light beams IL1 and IL2 used to measure the patterns 2a and 3a and with the illumination light beams IL3 and IL4 used to measure the patterns 2b and 3b. In other words, the marks are illuminated with the illumination light beams IL1 through IL4 in order to measure the positions in the X-direction and the Y-direction simultaneously. As illustrated in FIG. 4A, when the position in the X-direction is measured, the light beams from the illumination light beams IL3 and IL4, which are not used to measure the position in the X-direction, are scattered by the edges of the patterns 2a and 3a, and the scattered light beams result in flare and are mixed into a moire fringe signal. FIG. 4C illustrates a signal intensity (optical intensity distribution on a light-receiving surface of an image sensor), along a section, of the moire fringe signal illustrated in FIG. 4A. FIG. 4C reveals that the light beams scattered by the edges of the patterns 2a and 3a have entered the moire fringe signal, which results in high peaks at the edges of the signal intensity, and that an influence of the scattered light beams is large. Of the four cycles in the moire fringe signal, the two cycles are affected by the scattered light beams, which affects the accuracy in measuring the position. In addition, the same applies in the measurement of the position in the Y-direction, and it has been found that the light beams from the illumination light beams IL1 and IL2, which are not used to measure the position in the Y-direction, are scattered by the edges of the patterns 2b and 3b, and the scattered light beams result in flare and are mixed into a moire fringe signal.

Typically, even in a case in which a mark that does not generate a moire fringe signal is detected, a light beam that is not used for the detection results in a scattered light beam and affects the accuracy in measuring the position, which will be described with reference to FIGS. 5A through 5D. FIG. 5A illustrates a mark for measuring the position in the X-direction and a mark for measuring the position in the Y-direction. FIG. 5B illustrates a detection signal (detection image) of light beams from the marks detected by an image sensor when the marks are illuminated with the illumination light beams IL1 and IL2 (an angular distribution in the Y-direction) on the pupil plane of the illumination optical system. When the marks are illuminated with the illumination light beams IL and IL2, a light beam is not detected from the mark for measuring the position in the X-direction, and only a signal of the light beam from the mark for measuring the position in the Y-direction is detected. FIG. 5C illustrates a detection signal (detection image) of light beams from the marks when the marks are illuminated with the illumination light beams IL3 and IL4 (an angular distribution in the X-direction) on the pupil plane of the illumination optical system. When the marks are illuminated with the illumination light beams IL3 and IL4, a light beam is not detected from the mark for measuring the position in the Y-direction, and only a signal of the light beam from the mark for measuring the position in the X-direction is detected. FIG. 5D illustrates a detection signal (detection image) of light beams from the marks when the marks are illuminated with the illumination light beams IL1, IL2, IL3 and IL4 on the pupil plane of the illumination optical system. Signals of the light beams from the marks for measuring the positions in the X-direction and the Y-direction can be detected simultaneously, but the edge portions of the marks shine due to the illumination light beams from the directions that are not the measurement directions, and a scattered light beam that is not needed to measure the position is generated in the detection signal. FIG. 5D illustrates the scattered light beams in thick lines. A scattered light beam has an intensity in a detection signal in the measurement direction, and thus using such a detection signal leads to a measurement error.

The alignment scope 172, which solves the problem described above, will now be described in detail with reference to FIGS. 6 through 9B. The alignment scope 172 includes an illumination optical system that illuminates the patterns 2a and 2b formed on the mold M and the patterns 3a and 3b on the substrate W, and a detection optical system that detects light beams from the patterns 2a and 3a and light beams from the patterns 2b and 3b. The patterns serving as the alignment marks are the same as those described above. As illustrated in FIG. 6, the illumination optical system includes a light source (not illustrated), an optical element 1, an aperture stop 20 disposed on the pupil plane of the illumination optical system, and a splitter prism 30 and illuminates a mark observation surface 40 (surface to be illuminated). The detection optical system is constituted by a light-receiving element 5 and a lens system that images a light beam from a mark onto a light-receiving surface of the light-receiving element 5. The splitter prism 30 also constitutes a portion of the detection optical system. The mark observation surface 40 and the optical element 1 have an optically conjugate positional relationship. A light beam from an alignment mark on the mark observation surface 40 is transmitted through a transmissive portion (in the vicinity of the optical axis) of the splitter prism 30 and reaches the light-receiving element 5. A light beam from the mark for measuring the position in the X-direction and a light beam from the mark for measuring the position in the Y-direction are both transmitted through the same lens (optical system), are transmitted through the transmissive portion of the splitter prism 30, and reach the light-receiving element 5.

The aperture stop 20 is disposed on a plane at which the aperture stop 20 is in a relationship of Fourier transform relative to the optical element 1 and used to block an unwanted light beam and a 0th-order ray from the optical element 1. The aperture stop 20 allows a portion of a light beam that is to be used to illuminate an alignment mark to pass through its aperture portion and blocks the remaining portion of the light beam. The light beam that has passed through the aperture in the aperture stop 20 is reflected by a reflective surface of the splitter prism 30 and illuminates the mark observation surface 40.

The optical element 1 can be constituted by an element that deflects the angle of a light beam, such as a diffractive optical element, a microlens array, a spatial modulator (digital mirror array), or a prism. The optical element 1 is disposed in an optical path of one illumination optical system that illuminates an image plane with a light beam from the light source. FIG. 7 illustrates a plan view of the optical element 1. Here, an example in which the optical element 1 is a diffractive optical element is illustrated. The optical element 1 includes an A region that diffracts a light beam in the Y-direction at a diffraction angle φ and a B region that diffracts a light beam in the X-direction at a diffraction angle φ when a light beam is incident normally on the optical element 1. Light beams diffracted by the A region in the Y-direction at the diffraction angle φ are indicated by black dots in FIG. 8A, and light beams diffracted by the B region in the X-direction at the diffraction angle θ are indicated by black dots in FIG. 8B. As illustrated in FIG. 9A, a light beam incident on the A region at a maximum angle of incidence of θ/2 has a distribution (black dots) in which the angle θ and the diffraction angle φ in the Y-direction are convoluted at a position of the pupil plane (aperture stop 20). The diffracted light beams illuminate a portion (first portion) at a position corresponding (conjugate) to the A region in the mark observation surface 40 with the angular distribution (first angular distribution) illustrated in FIG. 9A. In a similar manner, as illustrated in FIG. 9B, a light beam incident on the B region at a maximum angle of incidence of θ/2 has a distribution (black dots) in which the angle θ and the diffraction angle φ in the X-direction are convoluted at a position of the pupil plane (aperture stop 20). The diffracted light beams illuminate a portion (second portion) at a position corresponding (conjugate) to the B region in the mark observation surface 40 with the angular distribution (second angular distribution) illustrated in FIG. 9B. An example in which the A region and the B region are provided on a single glass plate (single optical member) has been illustrated. Alternatively, the optical element 1 may be configured such that a glass plate on which the A region is formed and another glass plate on which the B region is formed are disposed adjacent to each other.

FIG. 10 illustrates the aperture stop 20. The aperture stop 20 allows a portion of a light beam that is to be used to illuminate an alignment mark to pass through its aperture portions IL1A, IL2A, IL3A, and IL4A and blocks the remaining portion of the light beam. Illumination light beams that have passed through the aperture portions IL1A and IL2A illuminate a portion at a position corresponding to the A region, and illumination light beams that have passed through the aperture portions IL3A and IL4A illuminate a portion at a position corresponding to the B region. The 0th-order ray from the optical element 1 is blocked by the blocking portion of the aperture stop 20.

A light beam that illuminates an alignment mark has an angular distribution (first angular distribution) in the Y-direction at a portion corresponding to the A region or has an angular distribution (second angular distribution) in the X-direction at a portion corresponding to the B region. In the portion at a position corresponding to the A region in the mark observation surface 40, a mark (first alignment mark) for detecting the relative position of the mold M and the substrate W in the X-direction, such as the pattern 2a and the pattern 3a, is disposed. In addition, in the portion at a position corresponding to the B region in the mark observation surface 40, a mark (second alignment mark) for detecting the relative position of the mold M and the substrate W in the Y-direction, such as the pattern 2b and the pattern 3b, is disposed. Therefore, a light beam from the first alignment mark illuminated with the first angular distribution and a light beam from the second alignment mark illuminated with the second angular distribution are detected by the light-receiving element 5.

In this manner, with the use of the alignment scope 172, an illumination light beam having an angular distribution in the Y-direction is formed in a portion corresponding to the A region, and an illumination light beam having an angular distribution in the X-direction is formed in a portion corresponding to the B region. In other words, the portion corresponding to the A region is not illuminated with an illumination light beam having an angular distribution in the X-direction, and thus scattered light beams caused by the illumination light beams IL3 and IL4, which are conventionally generated at the right and left sides of the mark for measuring the position in the X-direction, are not generated. In addition, the portion corresponding to the B region is not illuminated with an illumination light beam having an angular distribution in the Y-direction, and thus scattered light beams caused by the illumination light beams IL1 and IL2, which are conventionally generated at the upper and lower sides of the mark for measuring the position in the Y-direction, are not generated.

FIG. 11 illustrates the signal intensity, along a section in the X-direction, of a moire fringe signal of light beams diffracted by the pattern 2a and the pattern 3a in the portion corresponding to the A region. As the scattered light beams are reduced at the edges of the signal intensity, a signal having four cycles that is to be used to measure the position can be detected with high accuracy. In this manner, illuminating a plurality of marks that mutually differ in terms of the direction in which the position is measured with different illumination light beams (angular distributions) can suppress an occurrence of an unwanted scattered light beam, and a light beam from an alignment mark can thus be detected.

The data of the moire fringe signal of the light beams diffracted by the pattern 2a and the pattern 3a in the portion corresponding to the A region detected by the light-receiving element 5 of the alignment scope 172 in this manner is transmitted to a data processing unit, such as the control unit CNT. Then, the data processing unit can identify a peak position from the data of the moire fringe signal and obtain the relative position of the mold M and the substrate W (shot region) in the X-direction. The data of the moire fringe signal does not contain an unwanted light beam from a scattered light beam and thus has a high S/N ratio. Accordingly, a decrease in the accuracy of measuring the position of the mark can be suppressed. The control unit CNT drives the substrate stage 164 on the basis of the obtained relative position and positions the mold M and the substrate W (shot region) relative to each other. Alternatively, the control unit CNT may position the mold M and the substrate W (shot region) relative to each other on the basis of the peak position of the moire fringe signal without obtaining the relative position.

As described above, the illumination optical system includes an optical element that includes a region configured to form an illumination light beam for illuminating a first portion of a surface to be illuminated with a first angular distribution and a region configured to form an illumination light beam for illuminating a second portion that is different from the first portion of the surface to be illuminated with a second angular distribution that is different from the first angular distribution. In addition, the detection optical system is configured to detect a light beam from a first alignment mark in the first portion of the surface to be illuminated with the first angular distribution and to detect a light beam from a second alignment mark in the second portion of the surface to be illuminated with the second angular distribution. Accordingly, the first alignment mark is not illuminated with an illumination light beam having the second angular distribution, and the second alignment mark is not illuminated with an illumination light beam having the first angular distribution. Thus, an unwanted light beam that is not used to measure the position, such as a scattered light beam from an edge of a mark, is not generated.

When a light source, such as a laser, having high coherence is used as a light source for the alignment scope 172, a speckle may be generated on the mark observation surface 40. In this case, a speckle can be reduced by disposing a polarization element, such as a polarization plate, or an optical rotation element on the pupil plane of the illumination optical system. A speckle can be reduced by disposing a polarization element or an optical rotation element on the pupil plane such that the polarization direction of an illumination light beam in the upper portion (+1st-order ray) illustrated in FIG. 9A and the polarization direction of an illumination light beam in the lower portion (−1st-order ray) illustrated in FIG. 9A are orthogonal to each other. The optical element 1 is disposed at a position at which the optical element 1 is conjugate to the mark observation surface 40, and thus an actuator (driving unit) 6 for changing the position of the optical element 1 in the optical axis direction (Z-direction) of the illumination optical system is provided in order to bring the focus (imaging position) of the illumination light beam onto the mark observation surface 40.

In addition, the actuator 6 may be configured to be able to change the position of the optical element 1 in the direction perpendicular to the optical axis direction of the illumination optical system, and the center position of the alignment mark and the illumination region by the optical element 1 can be positioned relative to each other. As illustrated in FIG. 12, an optical element 1' provided with A, B, C, and D regions that differ in the diffraction angle or the size depending on the size of an alignment mark or the direction of measurement can also be used. For example, the position of the alignment mark and the position of the illumination region of the optical element 1' can be positioned relative to each other by driving the optical element 1' in the direction perpendicular to the optical axis direction of the illumination optical system with the use of the actuator 6. When the wavelength of a light beam to be used to detect an alignment mark is changed, the diffraction angle of a light beam diffracted by the optical element 1 changes, and thus a region to be used can be changed by moving the optical element 1 with the actuator 6 in accordance with the wavelength of a light beam to be used. In addition, a plurality of optical elements 1 that mutually differ in terms of the diffraction angle may be prepared, and a switching unit that switches among the plurality of optical elements 1 and disposes one of the optical elements 1 in an optical path in accordance with the wavelength of a light beam to be used can also be provided. In addition, the positioning may be achieved by rotating the optical element 1 about the optical axis of the illumination optical system with the use of the actuator 6 in accordance with the angle of rotation of the alignment mark.

As illustrated in FIG. 10, with regard to a light beam incident on the aperture portion IL1A, the diffraction angle differs depending on the wavelength between a light beam having a relatively longer wavelength and a light beam having a relative shorter wavelength, as indicated by the dashed-two-dotted line, and thus the position of the light beam having a longer wavelength and the position of the light beam having a shorter wavelength are offset from each other on the pupil plane. In this case, a region in which the light beams overlap between the light beams having different wavelengths to be used can also be cut out by the aperture portion IL1A.

As described above, the present exemplary embodiment can also be applied to a case in which marks that do not generate a moire fringe signal as illustrated in FIG. 5A are detected. Thus far, only the marks for measuring the positions in the X-direction and the Y-direction have been described. However, as illustrated in FIG. 13, it is also possible to illuminate a mark for measuring in the direction of 45° with an illumination light beam distribution (IL7, IL8) on the pupil plane and to illuminate a mark for measuring in the direction of −45° with an illumination light beam distribution (IL5, IL6) on the pupil plane. Thus, the present exemplary embodiment can be applied without any limiting conditions in terms of the angle or the direction of the mark or the distribution of the illumination light beam. In addition, an occurrence of a scattered light beam can be further suppressed by employing a mark in which the width or the pitch of a periodic pattern is made to differ between in an edge portion thereof and in the center portion thereof for suppressing a scattered light beam.

When a spatial modulator is used as the optical element 1, the angular distribution of the illumination light beam can be changed by time. Acquisition of an image with the light-receiving element 5 by illuminating a mark in a portion corresponding to the B region with the second angular distribution and acquisition of an image with the light-receiving element 5 by illuminating a mark in a portion corresponding to the A region with the first angular distribution can be carried out temporally separately. In this case, detection of a mark for measuring the position only in the X-direction and detection of a mark for measuring the position only in the Y-direction can be temporally separated, and thus a light beam that is not to be used to measure the position can be prevented from being mixed into a detection signal (light-receiving element 5) in the form of a scattered light beam.

In addition, even when a diffractive optical element is used as the optical element 1, the following processing can be carried out temporally separately. Specifically, the processing of acquiring an image with the light-receiving element 5 by illuminating a mark in a portion corresponding to the A region with the first angular distribution by illuminating the A region and acquiring an image with the light-receiving element 5 by illuminating a mark in a portion corresponding to the B region with the second angular distribution by illuminating the B region can be carried out temporally separately.

In addition, with regard to another example of the alignment scope 172, even in a case in which an illumination light beam is formed by an aperture stop without using the optical element 1, the following processing can be carried out temporally separately. Specifically, the processing of acquiring an image with the light-receiving element by illuminating a portion corresponding to the A region by forming an illumination light beam having the first angular distribution with the use of the aperture stop and acquiring an image with the light-receiving element by illuminating a portion corresponding to the B region by forming an illumination light beam having the second angular distribution with the use of the aperture stop can be carried out temporally separately. In this case, a variety of angular distributions can be formed by selectively blocking a plurality of apertures in the aperture stop, by rotating the aperture stop, or by switching among a plurality of aperture stops that mutually differ in terms of the position of the aperture and disposing a switched one of the aperture stops in an optical path.

As described above, a first step of an illumination optical system forming an illumination light beam having a first angular distribution and illuminating a first alignment mark with the first angular distribution and a detection optical system detecting a light beam from the first alignment mark illuminated with the first angular distribution is carried out. Then, after the first step, a second step of the illumination optical system forming an illumination light beam having a second angular distribution and illuminating a second alignment mark with the second angular distribution and the detection optical system detecting a light beam from the second alignment mark illuminated with the second angular distribution can be carried out. Thus, a decrease in the accuracy of measuring the position of the mark can be suppressed.

Method of Manufacturing Article

A method of manufacturing an article (a semiconductor integrated circuit device, a liquid crystal display device, a microelectromechanical sensor (MEMS), a hard disk, a color filter, etc.) includes a step of transferring (forming) a pattern on a substrate (a wafer, a glass plate, a film-like substrate, etc.) by using the imprint apparatus described above. Furthermore, the stated method of manufacturing an article may include a step of processing the substrate on which the pattern has been formed through etching, dicing, or the like. It is to be noted that, when another article, such as a patterned medium (recording medium) or an optical element, is to be manufactured, the stated method of manufacturing an article may include another processing step of processing the substrate on which the pattern has been transferred instead of an etching step. According to this method of manufacturing an article, an article having a higher quality than a conventional article can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-164014 filed Aug. 21, 2015, which is hereby incorporated by reference herein in its entirety.

The invention claimed is:

1. A detection device, comprising:
    an illumination optical system configured to illuminate a first alignment mark for detecting a position of an object in a first direction and a second alignment mark for detecting a position of the object in a second direction that is different from the first direction; and
    a detection optical system configured to detect light beams from the first alignment mark and the second alignment mark,
    wherein the illumination optical system includes an optical element disposed at a position optically conjugate to a surface to be illuminated, the optical element including a first region configured to form an illumination light beam for illuminating a first portion of the surface to be illuminated with a first angular distribution and a second region configured to form an illumination light beam for illuminating a second portion that is different from the first portion of the surface to be illuminated with a second angular distribution that is different from the first angular distribution,
    wherein the detection optical system is configured to detect a light beam from the first alignment mark in the first portion of the surface to be illuminated with the first angular distribution and to detect a light beam from the second alignment mark in the second portion of the surface to be illuminated with the second angular distribution.

2. The detection device according to claim 1, wherein the optical element is one of a diffractive optical element, a lens array, a prism, and a spatial modulator.

3. The detection device according to claim 1, wherein the detection device includes a driving unit configured to drive the optical element.

4. The detection device according to claim 3, wherein the driving unit is configured to change a position of the optical element in an optical axis direction of the illumination optical system.

5. The detection device according to claim 3, wherein the driving unit is configured to change a position of the optical element in a direction perpendicular to an optical axis direction of the illumination optical system on the basis of position of the alignment mark.

6. The detection device according to claim 3, wherein the driving unit is configured to rotate the optical element about an optical axis of the illumination optical system.

7. The detection device according to claim 1,
wherein the detection device includes a plurality of optical elements, and
wherein a switching unit configured to switch among the plurality of optical elements and dispose one of the optical elements in an optical path is provided.

8. The detection device according to claim 7, wherein the detection device is configured to switch an optical element to be disposed in the optical path in accordance with a wavelength of an illumination light beam.

9. The detection device according to claim 1, wherein the detection device includes a stop disposed on a plane on which the stop is in a relationship of Fourier transform relative to the optical element.

10. The detection device according to claim 1, wherein the detection device includes a polarization element disposed on a plane that is in a relationship of Fourier transform relative to the optical element.

11. An imprint apparatus configured to form a pattern on an imprint material by bringing a pattern in a mold into contact with the imprint material on a substrate, the imprint apparatus comprising:
the detection device according to claim 1,
wherein the detection device is configured to detect a positional deviation between the mold serving as an object and the substrate.

12. The detection device according to claim 1, wherein the first alignment mark included in the first portion is illuminated with the illumination light beam from the first region of the optical element with the first angular distribution by limiting an illumination region to the first portion of the surface to be illuminated, and the second alignment mark included in the second portion is illuminated with the illumination light beam from the second region of the optical element with the second angular distribution by limiting an illumination region to the second portion that is different from the first portion of the surface to be illuminated.

13. A method of manufacturing an article, the method comprising the steps of:
forming a pattern on a substrate by using an imprint apparatus; and
manufacturing an article by processing the substrate on which the pattern has been formed,
wherein the imprint apparatus forms a pattern on an imprint material by bringing a pattern in a mold into contact with the imprint material on a substrate, the imprint apparatus comprising:
a detection device configured to detect a positional deviation between the mold serving as an object and the substrate,
wherein the detection device comprises an illumination optical system configured to illuminate a first alignment mark for detecting a position of the mold in a first direction and a second alignment mark for detecting a position of the object in a second direction that is different from the first direction; and
a detection optical system configured to detect light beams from the first alignment mark and the second alignment mark,
wherein the illumination optical system includes an optical element disposed at a position optically conjugate to a surface to be illuminated, the optical element including a first region configured to form an illumination light beam for illuminating a first portion of the surface to be illuminated with a first angular distribution and a second region configured to form an illumination light beam for illuminating a second portion that is different from the first portion of the surface to be illuminated with a second angular distribution that is different from the first angular distribution,
wherein the detection optical system is configured to detect a light beam from the first alignment mark in the first portion of the surface to be illuminated with the first angular distribution and to detect a light beam from the second alignment mark in the second portion of the surface to be illuminated with the second angular distribution.

14. The method of manufacturing an article according to claim 13, wherein the optical element is one of a diffractive optical element, a lens array, a prism, and a spatial modulator.

15. The method of manufacturing an article according to claim 13, wherein the detection device includes a driving unit configured to drive the optical element.

16. The method of manufacturing an article according to claim 13,
wherein the detection device includes a plurality of optical elements, and
wherein a switching unit configured to switch among the plurality of optical elements and dispose one of the optical elements in an optical path is provided.

17. The method of manufacturing an article according to claim 16, wherein the detection device is configured to switch an optical element to be disposed in the optical path in accordance with a wavelength of an illumination light beam.

18. The method of manufacturing an article according to claim 13, wherein the detection device includes a stop disposed on a plane on which the stop is in a relationship of Fourier transform relative to the optical element.

19. The method of manufacturing an article according to claim 13, wherein the detection device includes a polarization element disposed on a plane that is in a relationship of Fourier transform relative to the optical element.

20. An illumination optical system configured to illuminate a first alignment mark for detecting a position of an object in a first direction and a second alignment mark for detecting a position of the object in a second direction that is orthogonal to the first direction, the illumination optical system comprising:
an optical element disposed at a position optically conjugate to a surface to be illuminated, the optical element including a first region configured to form an illumination light beam for illuminating a first portion of the surface to be illuminated with a first angular distribution of the direction that is either the first direction or the second direction and a second region configured to form an illumination light beam for illuminating a second portion that is different from the first portion of the surface to be illuminated with a second angular distribution of the other direction of the first direction or the second direction that is different from the first angular distribution, wherein the first alignment mark in the first portion of the surface to be illuminated is illuminated with the first angular distribution, and the second alignment mark in the second portion of the surface to be illuminated is illuminated with the second angular distribution.

\* \* \* \* \*